United States Patent [19]

Karr

[11] Patent Number: 5,683,535
[45] Date of Patent: Nov. 4, 1997

[54] METHOD AND APPARATUS OF PRODUCING CAVITIES IN LTCC SUBSTRATES

[75] Inventor: Scott P. Karr, Baltimore, Md.

[73] Assignee: Northrop Grumman Corporation, Los Angeles, Calif.

[21] Appl. No.: 686,000

[22] Filed: Jul. 25, 1996

[51] Int. Cl.⁶ .............................. B32B 31/04; B32B 31/20
[52] U.S. Cl. .............................. 156/285; 156/89; 156/289; 156/323; 156/382; 156/580
[58] Field of Search .............................. 156/89, 156, 285, 156/289, 323, 381, 382, 580, 583.1; 264/56, 58, 60, 61, 241, 313, 316

[56] References Cited

U.S. PATENT DOCUMENTS

| | | | |
|---|---|---|---|
| 4,636,275 | 1/1987 | Norell | 156/289 |
| 4,680,075 | 7/1987 | McNeal et al. | 156/289 |
| 4,737,208 | 4/1988 | Bloechle et al. | 156/90 |
| 5,116,440 | 5/1992 | Takeguchi et al. | 156/90 |
| 5,240,671 | 8/1993 | Carey | 419/9 |
| 5,435,875 | 7/1995 | Saitoh et al. | 156/245 |
| 5,478,420 | 12/1995 | Gauci et al. | 156/89 |
| 5,538,582 | 7/1996 | Natarajan et al. | 156/285 |

Primary Examiner—James Sells
Attorney, Agent, or Firm—Walter G. Sutcliff

[57] ABSTRACT

A method and apparatus which replaces the silicone molds heretofore utilized for protecting the integrity of the cavities formed during the lamination lay-up stage of a low temperature cofired ceramic substrate fabrication. Now a single sheet of compliant latex rubber is now applied over a polyimide template placed on top of the laminations following their stack-up on a tooling plate. Upon the application of pressure in an isostatic lamination procedure, the sheet of latex rubber acts to safely transfer laminating pressure to the cavities formed in the composite substrate structure without rounding the corners or edges thereof.

15 Claims, 3 Drawing Sheets

METHOD AND APPARATUS OF PRODUCING CAVITIES IN LTCC SUBSTRATES

BACKGROUND OF THE INVENTION

1. Field of the Invention

This invention relates generally to low temperature cofired ceramic substrates and more particularly to a method and apparatus for producing cavities in low temperature cofired ceramic substrates.

2. Description of the Prior Art

Low temperature cofired ceramic (LTCC) substrates used in connection with electronic circuitry, and more particularly integrated circuits, are generally well known and typically comprise a multilayered structure of ceramic material which includes stripline circuit patterns and openings therethrough called vias for providing circuit interconnection between layers. The layers are laminated together by pressure being externally applied, for example, by a hydrostatic press which is adapted to apply pressure in the order of 3000 psi to the laminate components.

As LTCC substrates have become more dense and complex, the integral cavities that are built into the substrates have increased in quantity and have become more complex in shape along with the number of ledges included therein. Due to these developments, the use of silicone molds which are inserted in the various cavities for defining as well as protecting the integrity of the sidewalls thereof, has become increasingly complex and time consuming, both in creating the molds as well as inserting the molds in the laminate structure during the lamination lay-up stage.

SUMMARY

Accordingly, it is a primary object of the present invention, therefore, to provide an improvement in the process of manufacturing a substrate for use in connection with electronic circuits.

It is another object of the invention to provide an improvement in the process of fabricating laminated substrates used in connection with electronic circuits.

It is a further object of the invention to provide an improvement in low temperature cofired ceramic substrates without the use of silicone molds.

The foregoing and other objects of this invention are achieved by a method and apparatus which replaces the silicone molds heretofore utilized in the lamination lay-up stage of a low temperature cofired ceramic substrate fabrication wherein the lamination process is carried out by applying pressure to the substrates for bonding the laminations together. A single sheet of compliant latex rubber is now applied over a polyimide template placed on top of the laminations following their stack-up on a tooling plate. Upon the application of pressure in an isostatic lamination procedure, the sheet of latex rubber acts to safely transfer laminating pressure to the cavities formed in the composite substrate structure.

A preferred method of the invention resides in the steps of: stacking a plurality of low temperature cofired ceramic substrate members and forming thereby at least one integral cavity therein; placing a template over the stack of substrate members, the template including an opening therein conforming to the size and shape of the cavity formed in the stack of substrate members; placing a relatively thin sheet of compliant material, for example a single sheet of relatively thin latex rubber, over the template; placing silicone foam sheeting above and below the stack of substrate members, the template and the sheet of compliant material; placing the parts in a flexible package which is evacuated; and subjecting the package to an external hydrostatic pressure for laminating the substrate members, the relatively thin sheet of latex rubber transferring the laminating pressure from the outside of the package to the bottom and ledges of the cavity.

The preferred embodiment of the apparatus is comprised of: a tooling plate for stacking plural sheets of low temperature cofired ceramic (LTCC) thereon and forming at least one integral cavity therein; a 0.025 in. thick polyimide template for covering the LTCC sheets when stacked on the tooling plate, the template including an opening therein conforming to the size and shape of the cavity; a 0.008 in. latex rubber sheet for placement over the template and the one cavity for transferring pressure to the inside of at least one cavity while protecting the corners and preventing the rounding of the edges thereof; pairs of 0.125 in. silicone foam sheets placed above and below the LTCC sheets, the template and the sheet of latex rubber for providing a protective barrier therefor and forming thereby a lamination stack-up assembly; a flexible vacuum package for receiving said lamination stack-up assembly therein; and an external pressure chamber for receiving the vacuum package and the stack-up assembly and generating a pressure therein for bonding the LTCC sheets into a laminated composite substrate.

Further scope of applicability of the present invention will become apparent from the detailed description given hereinafter. However, it should be understood that the detailed description and specific example, while indicating the preferred method of the invention, is given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description and given hereinbelow in the accompanying drawings which are given by way of illustration, and thus are not limitative of the present invention, and wherein.

DETAILED DESCRIPTION OF THE INVENTION

Figure 1:
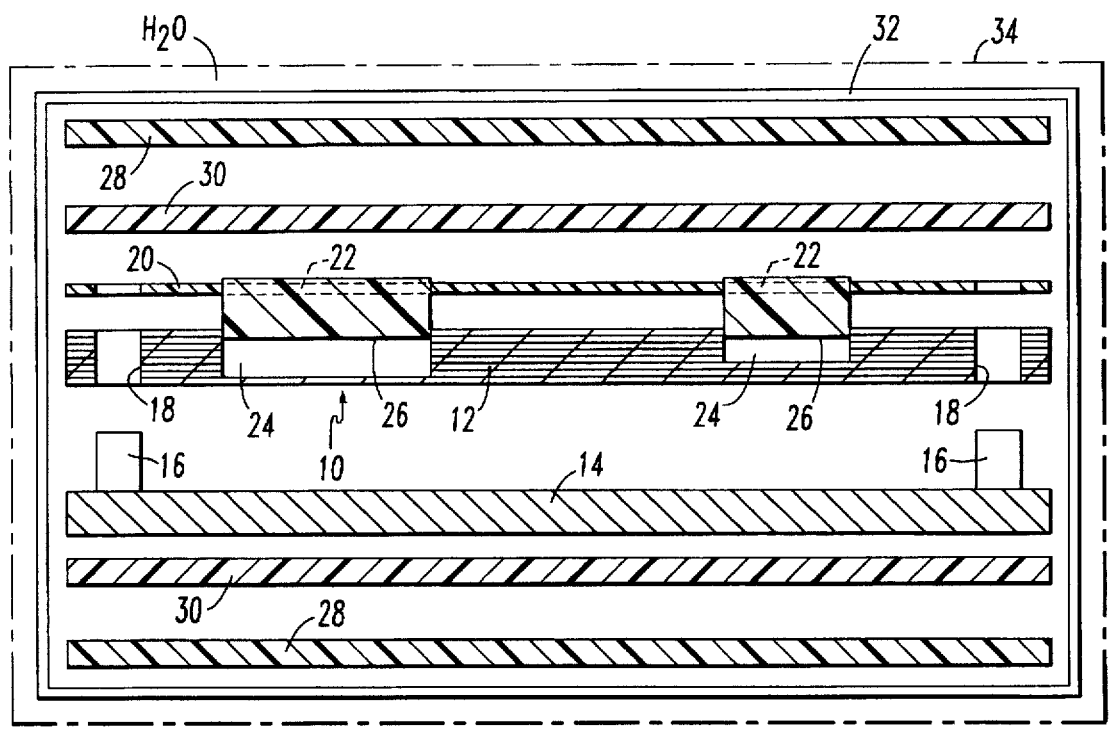
FIG. 1 is an exploded cross sectional view which is illustrative of the method for forming a low temperature cofired ceramic substrate in accordance with the known prior art.
Figure 2:
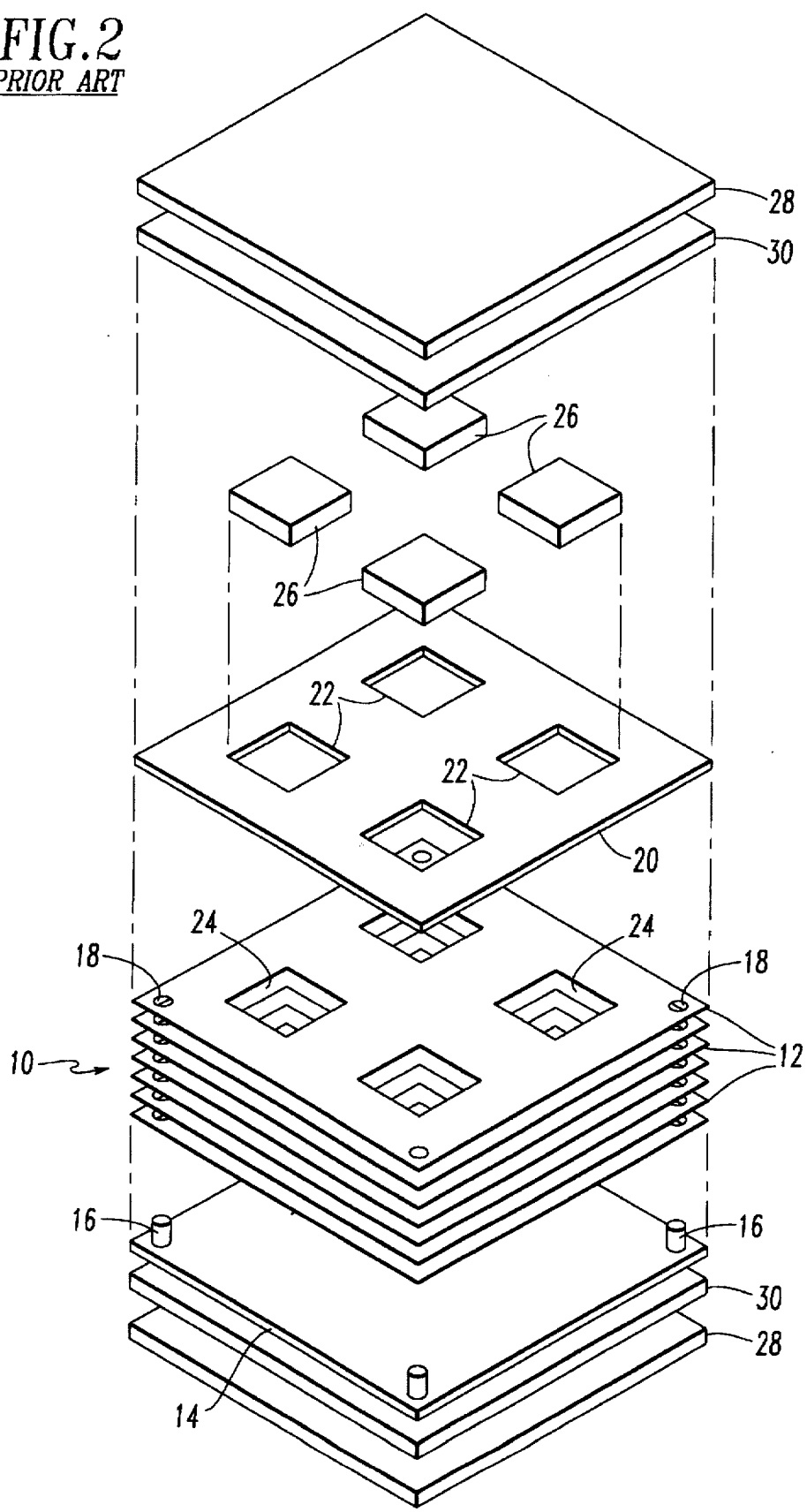
FIG. 2 is an exploded perspective view of the components shown in FIG. 1.

Referring now to the figures and more particularly to FIGS. 1 and 2, shown thereat is a typical prior art set up for fabricating a low temperature cofired ceramic laminated substrate 10 comprised of a stack of LTCC sheets 12.

In a lamination process in accordance with the known prior art, a plurality of LTCC sheets 12 are stacked on a stainless steel tooling plate 14 having, for example, one or more alignment pins 16 which receive corresponding holes 18 in the LTCC sheets 12. A 0.025 in. thick polyimide template 20 is placed over the stack of substrate sheets 12 and includes one or more openings 22 therein for defining a corresponding number of cavities 24 in the composite structure of the substrate 10. The cavities 24 consist in various shapes and numbers of ledges, not shown.

In order to protect the corners of the cavities 24 and to prevent any rounding of the edges thereof during the lamination process, one or more silicone molds 26 having an inner surface contour corresponding to the geometry of the cavities 24, are fitted over the template 20 and into the cavities 24. Next, pairs of 0.125 in. thick silicone foam sheets 28 and 30 are trimmed to the required area of the parts and are placed above and below the assembly including the tooling plate 14, template 20, and silicone mold 26. The assembly is next placed in a flexible vacuum bag, shown schematically by reference numeral 32. The silicone rubber sheets 28 and 30 act as a protective barrier to keep the vacuum bag 32 from being punctured by a rigid edge of the lamination stack-up assembly located therebetween.

The vacuum bag 32 and its contents are then placed in a hydrostatic pressure chamber shown by the phantom lines 34. The hydrostatic pressure chamber 34 generates a 3000 psi. pressure which is transferred from the outside of the vacuum-bagged package which isostatically laminate the LTCC sheets 12 together, forming a composite substrate structure 10.

As the substrates become more complex in shape and the number of ledges included therein, the silicone molds 26 necessarily have become increasingly complex and time consuming, both in creating the molds as well as inserting them during the lamination lay-up stage.

Figure 3:
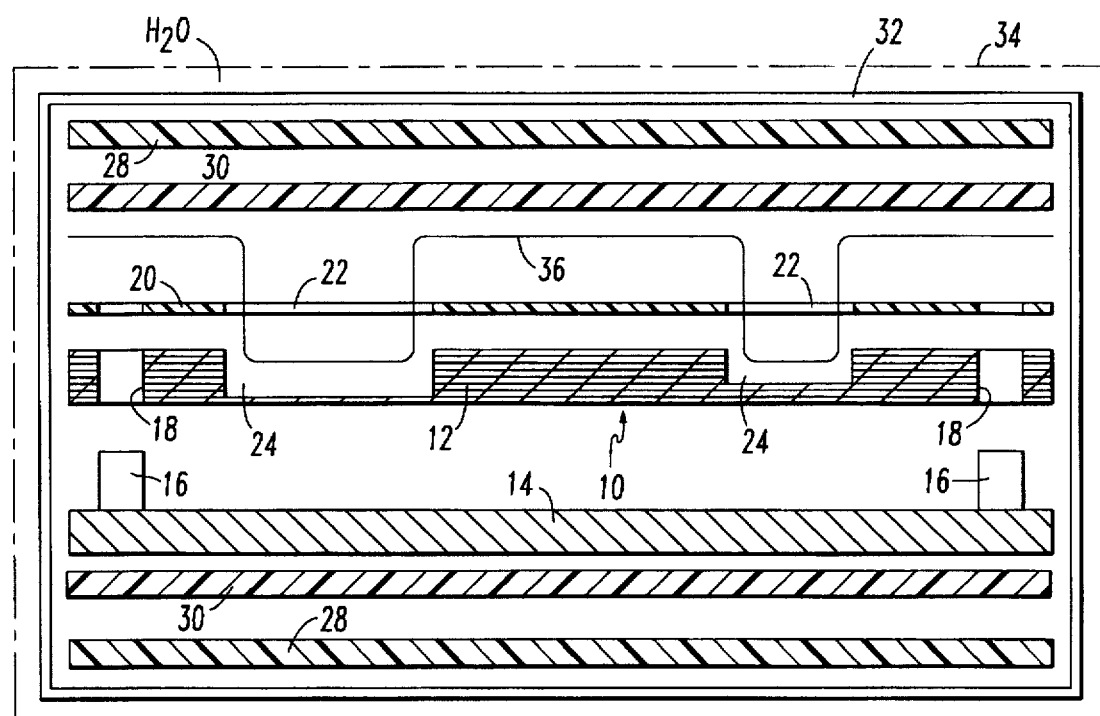
FIG. 3 is an exploded cross sectional view generally illustrative of the preferred method of the subject invention.
Figure 4:
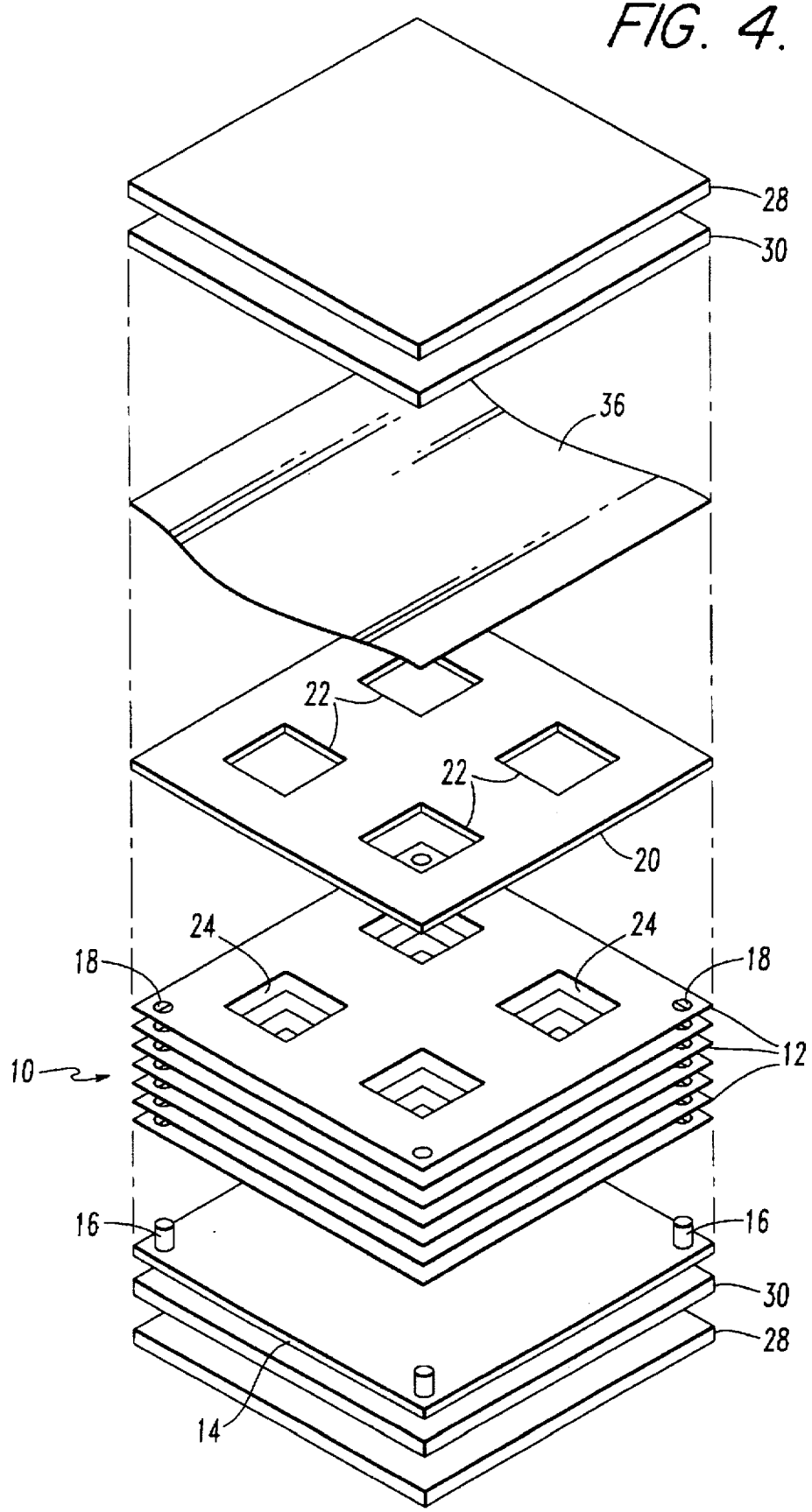
FIG. 4 is an exploded perspective view of the components shown in FIG. 3.

In the instant invention, as shown in FIGS. 3 and 4, the silicone molds 26 of the prior art are replaced by a single sheet 36 of 0.008 in. thick latex rubber. The remainder of the lamination set up is the same as in the prior art, including the 0.025 in. thick polyimide cavity template 20, the stainless steel tooling plate 14, and the pairs of exterior 0.125 in. thick silicone foam sheets 28 and 30.

The single sheet of 0.008 in. thick latex rubber was found to provide the necessary compliance to allow the 3000 psi. lamination pressure to transfer down to the bottom and the ledges of the cavities 24 during the lamination process. Experiments were performed using latex thicknesses of 0.004, 0.006, 0.008, 0.010, 0.012 and 0.025 in.; however, it was found that a 0.008 in. thickness exhibited the required conformity when used during the isostatic lamination process without tearing or rounding the corners of the cavities.

The elimination of the mold generation step leads to significant cycle time reductions in lamination, since there is no step required to insert molds prior to lamination and removal of molds after lamination. Thus what has been shown and described is an improved method and apparatus for producing cavities in multi-layer ceramic substrates consisting of low temperature cofired ceramic sheets.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A method of fabricating a cofired ceramic laminated substrate for electronic circuitry, comprising the steps of:
   (a) stacking a plurality of substantially flat substrate low temperature cofired ceramic members and forming thereby at least one integral cavity therein;
   (b) placing a polyimide template over the stack of substrate members, said template including an opening therein conforming to the size and shape of the cavity formed in the ceramic members;
   (c) placing a single relatively thin, flat, flexible, sheet of tear resistant, latex rubber over the surface of the template including said opening;
   (d) placing relatively thick silicon foam sheeting above and below the stack of substrate members, the template, and the single sheet of latex rubber to provide an external protective barrier therefor;
   (e) placing all of the components in a flexible vacuum-bagged package; and
   (f) placing said package in a hydrostatic pressurization chamber and generating a predetermined internal pressure for bonding the substrate members into a laminated substrate in a single pressurization step, the relatively thin sheet of latex rubber transferring said predetermined pressure from outside the package to the inside of the cavity without rounding the edges thereof.

2. The method of claim 1 wherein said substrate members comprise sheets of low temperature cofired ceramic.

3. The method of claim 1 wherein said sheet of latex rubber is between 0.006 and 0.010 in. thick.

4. The method of claim 1 wherein said sheet of latex rubber is about 0.008 in. thick.

5. The method of claim 4 wherein said silicone foam sheeting comprises a pair of 0.125 in. thick silicone foam sheets.

6. The method of claim 1 wherein said polyimide template is about 0.025 in. thick.

7. The method of claim 1 wherein said step of generating in step (f) comprises generating an internal pressure of about 3000 psi.

8. The method of claim 1 wherein said step (a) of 5 stacking comprises stacking said plurality of substrate members on a tooling plate.

9. An article of manufacture prepared by a process comprising the steps of:
   (a) stacking a plurality of substantially flat substrate low temperature cofired ceramic members and forming thereby at least one integral cavity therein;
   (b) placing a polyimide template over the stack of substrate members, said template including an opening therein conforming to the size and shape of the cavity;
   (c) placing a single relatively thin, flat, flexible, sheet of tear resistant latex rubber over the surface of the template including the opening therein;
   (d) placing relatively thick silicon foam sheeting above and below the stack of substrate members, the template, and the sheet of latex rubber to provide an external protective barrier therefor;
   (e) placing all of the components in a flexible vacuum-bagged package; and
   (f) placing said package in a hydrostatic pressurization chamber and generating a predetermined internal pressure for bonding the substrate members into a laminated substrate in a single pressurization step, the relatively thin sheet of latex rubber transferring said predetermined pressure from outside the package to the inside of the cavity without rounding the edges thereof.

10. Apparatus for fabricating a low temperature cofired ceramic substrate comprising:
   a tooling plate for stacking a plurality of sheets of low temperature cofired ceramic and forming thereby at least one integral cavity therein;

a polyimide template for covering said sheets when stacked on said tooling plate, said template including an opening therein conforming to the size and shape of the cavity formed in said sheets;

a single relatively thin flat sheet of compliant latex rubber placed over the template and said at least one cavity for transferring pressure to the inside of the cavity without rounding corners and edges thereof when subjected to pressurization;

at least one silicone foam sheet placed above and below a lamination stack-up assembly including said tooling plate, said sheets of low temperature cofired ceramic, said polyimide template and said sheet of latex rubber to provide a protective barrier for the assembly;

a flexible bag type vacuum package for receiving said lamination stack-up assembly therein; and an external pressure chamber for generating a predetermined pressure therein for bonding the sheets of low temperature cofired ceramic into a laminated substrate in a single pressurization step when said vacuum package and said lamination stack-up assembly are located therein.

11. The apparatus of claim 10 wherein said sheet of latex rubber is between 0.006 and 0.010 in. thick.

12. The apparatus of claim 10 wherein said sheet of latex rubber is about 0.008 in. thick.

13. The apparatus of claim 10 wherein said at least one silicone foam sheet comprises a pair of 0.125 in. thick silicone foam sheets.

14. The apparatus of claim 10 wherein said polyimide template comprises a sheet of polyimide having a thickness of about 0.025 in.

15. The apparatus of claim 10 wherein said predetermined pressure is about 3000 psi.

* * * * *